United States Patent
Roozrokh et al.

(10) Patent No.: US 7,060,533 B2
(45) Date of Patent: Jun. 13, 2006

(54) METHOD FOR MANUFACTURING DIODE SUBASSEMBLIES USED IN RECTIFIER ASSEMBLIES OF ENGINE DRIVEN GENERATORS

(75) Inventors: Bahman Roozrokh, Casselberry, FL (US); Michael E. Fischer, Casselberry, FL (US)

(73) Assignee: Wetherill Associates, Inc., Royersford, PA (US)

( * ) Notice: Subject to any disclaimer, the term of this patent is extended or adjusted under 35 U.S.C. 154(b) by 185 days.

(21) Appl. No.: 10/620,552

(22) Filed: Jul. 16, 2003

(65) Prior Publication Data

US 2004/0014256 A1 Jan. 22, 2004

Related U.S. Application Data

(62) Division of application No. 09/928,974, filed on Aug. 13, 2001, now Pat. No. 6,642,078.

(60) Provisional application No. 60/228,381, filed on Aug. 28, 2000.

(51) Int. Cl.
*H01L 21/52* (2006.01)

(52) U.S. Cl. ........................ 438/115; 438/121; 438/122

(58) Field of Classification Search ................ 438/115, 438/121, 122, 124, FOR. 381, FOR. 382; 257/E21.5, E21.51

See application file for complete search history.

(56) References Cited

U.S. PATENT DOCUMENTS

| | | | | |
|---|---|---|---|---|
| 3,539,850 A | * | 11/1970 | Sato | 310/68 D |
| 3,629,631 A | | 12/1971 | Colton et al. | 310/68 D |
| 3,641,374 A | | 2/1972 | Sato | 310/68 D |
| 3,703,306 A | * | 11/1972 | LaChance | 428/98 |
| 3,737,738 A | | 6/1973 | Koenig | 317/234 R |
| 3,789,275 A | | 1/1974 | Sawano et al. | 317/234 R |
| 3,812,390 A | | 5/1974 | Richards | 310/68 D |
| 3,925,809 A | | 12/1975 | Striker | 357/81 |
| 3,927,338 A | | 12/1975 | Vieilleribiere | 310/68 D |
| 3,930,306 A | * | 1/1976 | Goldberg et al. | 29/854 |
| 3,959,676 A | | 5/1976 | Striker | 310/68 D |
| 4,074,420 A | | 2/1978 | Lofdahl | 29/628 |

(Continued)

FOREIGN PATENT DOCUMENTS

DE 197 11 955 10/1997

(Continued)

OTHER PUBLICATIONS

Patent Abstracts of Japan, vol. 1996, No. 08, Aug. 30, 1996 and JP 08 107272A, Apr. 23, 1996.

*Primary Examiner*—George Fourson
(74) *Attorney, Agent, or Firm*—Allen, Dyer, Doppelt, Milbrath & Gilchrist, P.A.

(57) ABSTRACT

A method of manufacturing a diode assembly used in rectifier assemblies of engine-driven generators is disclosed. The diode assemblies have diode cups, semiconductor diode dies and diode leads fitted therein. The diode subassemblies are reflow soldered, such that the semiconductor diode die and diode lead are reflow soldered within a diode cup in an argon/hydrogen atmosphere. In another aspect of the present invention, a lead loader having a removable lead holder that holds diode leads therein is positioned over a diode boat such that the diode leads are aligned with respective diode cups. The lead holder is slid from the lead loader so that the diode leads fall into the center cups which also have the semiconductor die positioned therein. The diode boat is inserted within a furnace for reflow soldering.

19 Claims, 16 Drawing Sheets

U.S. PATENT DOCUMENTS

| | | | |
|---|---|---|---|
| 4,098,452 A * | 7/1978 | Webster et al. | 228/123.1 |
| 4,103,193 A * | 7/1978 | Ito | 310/68 D |
| 4,189,653 A | 2/1980 | Hiratuka et al. | 310/68 D |
| 4,218,694 A | 8/1980 | Grzybowski | 357/76 |
| 4,278,867 A | 7/1981 | Tan | 219/121 LD |
| 4,321,664 A * | 3/1982 | Matthai | 363/144 |
| 4,419,597 A | 12/1983 | Shiga et al. | 310/68 D |
| 4,496,098 A | 1/1985 | Kawakatsu | 228/219 |
| 4,604,538 A * | 8/1986 | Merrill et al. | 310/68 D |
| 4,606,000 A * | 8/1986 | Steele et al. | 363/145 |
| 4,749,980 A | 6/1988 | Morrill, Jr. et al. | 337/232 |
| 4,929,516 A * | 5/1990 | Pryor et al. | 428/620 |
| 4,952,829 A | 8/1990 | Armbruster et al. | 310/68 D |
| 4,959,707 A * | 9/1990 | Pinchott | 257/723 |
| 4,978,052 A * | 12/1990 | Fister et al. | 228/123.1 |
| 5,005,069 A | 4/1991 | Wasmer et al. | 357/72 |
| 5,043,614 A | 8/1991 | Yockey | 310/68 D |
| 5,071,058 A | 12/1991 | Nowotarski | 228/219 |
| 5,098,514 A | 3/1992 | Held | 156/583.1 |
| 5,331,231 A | 7/1994 | Koplin et al. | 310/68 D |
| 5,409,543 A | 4/1995 | Panitz et al. | 134/2 |
| 5,438,479 A | 8/1995 | Heilbronner | 361/707 |
| 5,451,823 A | 9/1995 | Deverall et al. | 310/68 D |
| 5,453,648 A | 9/1995 | Bradfield | 310/71 |
| 5,659,212 A * | 8/1997 | DePetris | 310/68 D |
| 5,682,070 A | 10/1997 | Adachi et al. | 310/71 |
| 5,773,885 A * | 6/1998 | Steele | 257/710 |
| 5,812,388 A * | 9/1998 | Keidar et al. | 363/145 |
| 5,991,184 A | 11/1999 | Russell et al. | 363/145 |
| 6,306,516 B1 | 10/2001 | Jin et al. | 428/469 |
| 6,476,480 B1 * | 11/2002 | Staab et al. | 257/693 |
| 6,528,911 B1 * | 3/2003 | De Petris | 310/64 |
| 6,667,545 B1 * | 12/2003 | Spitz | 257/688 |

FOREIGN PATENT DOCUMENTS

| | | |
|---|---|---|
| EP | 0 411 596 | 2/1991 |
| EP | 0 539 725 | 5/1993 |

* cited by examiner

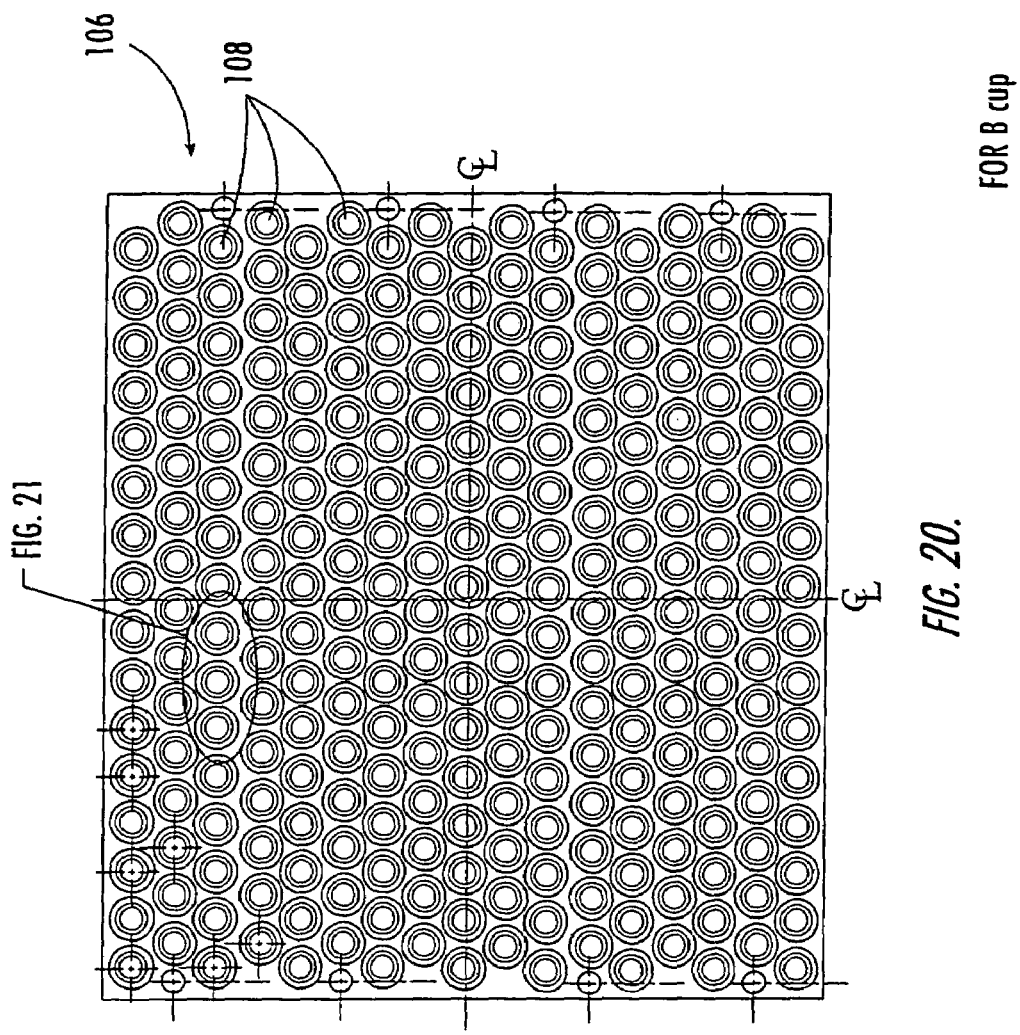
FIG. 20.
FOR B cup
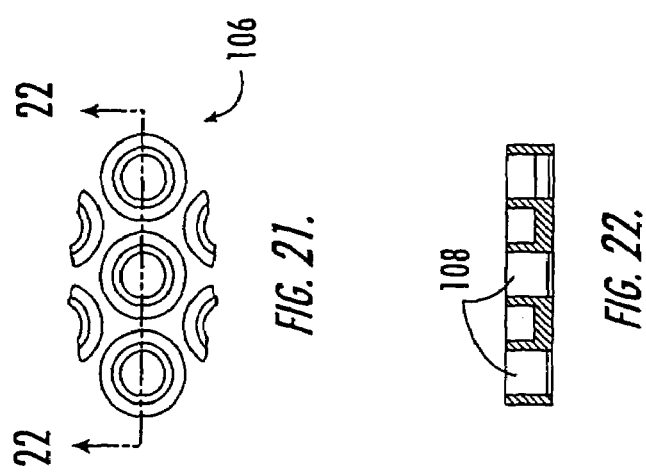
FIG. 21.
FIG. 22.

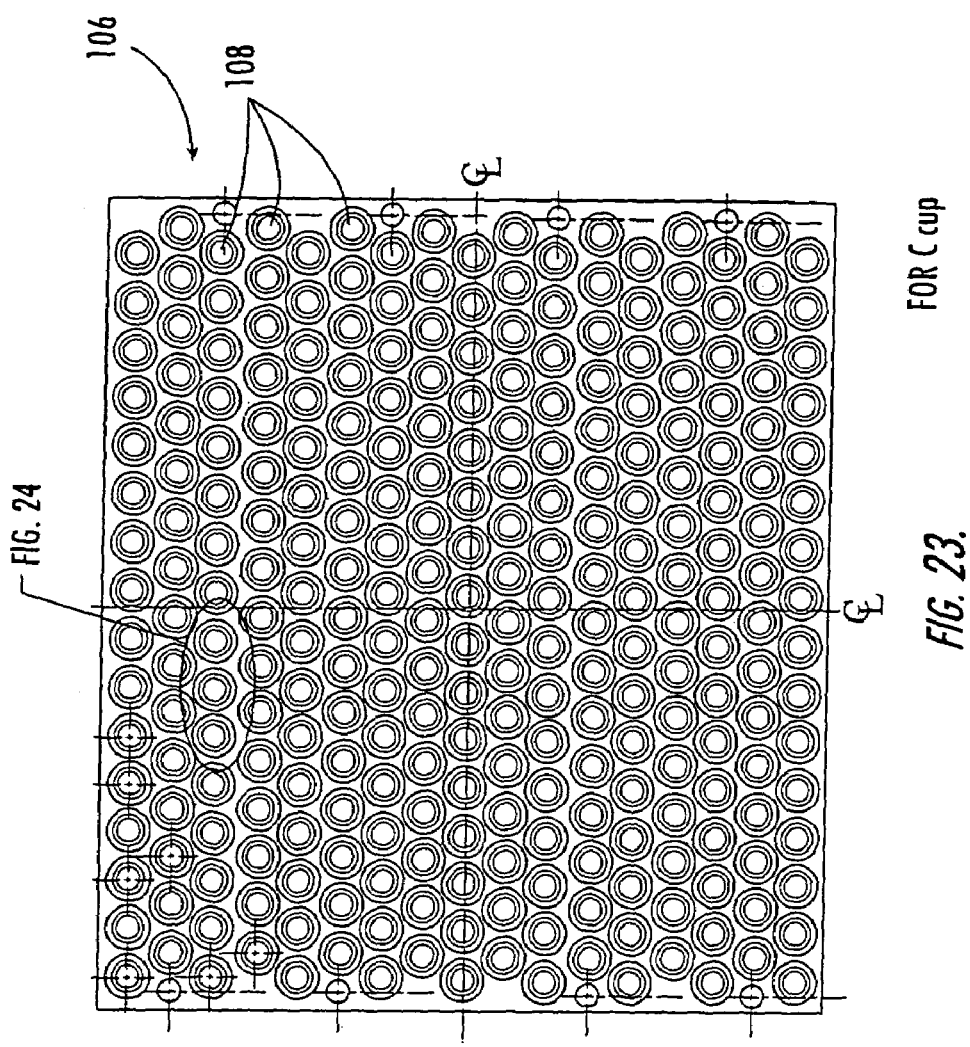
FIG. 23.
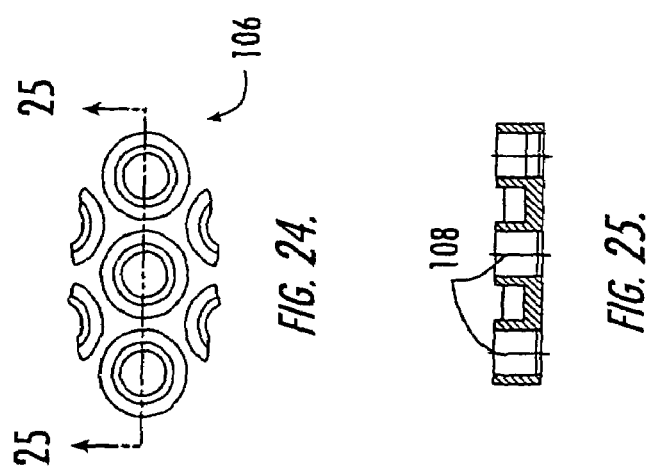
FIG. 24.
FIG. 25.

METHOD FOR MANUFACTURING DIODE SUBASSEMBLIES USED IN RECTIFIER ASSEMBLIES OF ENGINE DRIVEN GENERATORS

RELATED APPLICATION

This application is a divisional of Ser. No. 09/928,974, filed Aug. 13, 2001 U.S. Pat. No. 6,642,078, which is based on provisional application Ser. No. 60/228,381 tiled on Aug. 28, 2000, the disclosures of which are hereby incorporated by reference in their entirety.

FIELD OF THE INVENTION

This invention relates to the field of rectifier assemblies used in engine-driven generators, such as automotive alternators, and more particularly, this invention relates to the field of manufacturing diode subassemblies used in such rectifier assemblies.

BACKGROUND OF THE INVENTION

Press fit diode subassemblies are commonly used in vehicular extended thermal cycle minimal part robust rectifier assemblies, such as the type shown in commonly assigned U.S. Pat. No. 5,991,184, the disclosure which is hereby incorporated by reference in its entirety. These press fit diode subassemblies are formed as a subassembly of diode parts and press fitted within electrically conductive cooling plates of the rectifier assemblies. A stand-up diode lead extends upward from a diode cup that is usually press-fitted and interconnects various generator, e.g., alternator components. The press fit diode subassemblies include a lower cup, a silicon or other semiconductor diode die used as the diode or rectifying components, a stand-up diode lead, and an epoxy formed over the exposed diode lead and upper area of the cup. These types of rectifier assemblies using these diode subassemblies are produced throughout the United States and world, an example which is shown in the '184 patent. A plurality, such as six press fit diode subassemblies, are manufactured for each rectifier such as that disclosed in the '184 patent, although the number of diode subassemblies can vary depending on the type of rectifier and its end use.

The manufacturing techniques used in producing these press fit and similar diode subassemblies used in rectifiers are critical important and the techniques used can make a difference between a rectifier having a short life versus a longer life. Thus, it is critically important that the manufacturing processes of the diodes subassemblies be carefully monitored and controlled to obtain optimum diode production and rectifier operation.

SUMMARY OF THE INVENTION

It is therefore an object of the present invention to provide an improved method and process for manufacturing diode subassemblies used in rectifiers for engine-driven generators such as in automotive applications.

The present invention is advantageous and provides a diode subassembly manufacturing process that is advantageous and produces diode subassemblies with less oxidation and in a manufacturing environment that allows more critical specifications to be met.

In accordance with the present invention, a method of manufacturing a diode subassembly used in rectifiers for engine-driven generators is disclosed. The diode subassembly includes a diode cup and semiconductor diode die and diode leads fitted therein. In one aspect of the present invention, the method advantageously reflow solders a semiconductor diode die and diode lead within a diode cup in an argon/hydrogen atmosphere. This is advantageous over many prior art processes where a hydrogen or nitrogen atmosphere is used.

In yet another aspect of the present invention, solder preforms are inserted between the diode cup and semiconductor diode die, and the diode lead and semiconductor diode die before reflow soldering. Reflow soldering can occur within an argon/hydrogen atmosphere of about 80% argon and 20% hydrogen. The step of reflow soldering can be at a temperature up to about 400° C. The step of reflow soldering can occur under pressure to aid in forcing the semiconductor diode die, diode cup and diode lead together.

In yet another aspect of the present invention, the step of reflow soldering can occur at a pressure up to about 60 pounds per square inch. The step of reflow soldering can occur with a lead-tin-indium solder. The step of reflow soldering can also comprise the step of sealing the diode cup, semiconductor diode die and diode lead with a sealant, such as epoxy.

In yet another aspect of the present invention, the method of manufacturing a diode assembly of the present invention comprises the steps of positioning a diode cup within a die boat having a plurality of soldering positions for holding diode cups therein. A lead loader has a removable lead holder that holds diode leads within the lead loader. The lead loader is positioned over the diode boat such that the diode leads are aligned with respective diode cups. The lead holder is removed from the lead loader such that the diode leads fall into the center cups, which also have the semiconductor diode die positioned therein. The die boat is positioned within an oven and the semiconductor diode die and diode lead are soldered within the diode cup in an argon/hydrogen atmosphere of the oven.

BRIEF DESCRIPTION OF THE DRAWINGS

Other objects, features and advantages of the present invention will become apparent from the detailed description of the invention which follows, when considered in light of the accompanying drawings in which:

FIG. 20 is a fragmentary top plan view of an upper retaining plate for a B cup shown in FIG. 15 and showing orifices through which diode leads can be dropped into diode cups.

FIG. 21 is a slightly enlarged view of a portion of FIG. 20.

FIG. 22 is a sectional view taken along line 22—22 of FIG. 21.

FIGS. 23–25 are views similar to FIGS. 20–22, but showing use with a "C" cup.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous for the manufacture of press fit diode subassemblies and other diode subassemblies used in the rectifier assemblies as shown in the incorporated by reference '184 patent. Naturally, other types of diode subassemblies used with different rectifiers and other applications can be processed, in accordance with the present invention. The following description is not limited to the illustrated types of rectifiers and diode subassemblies.

Figures 1A, 1B, 1C:
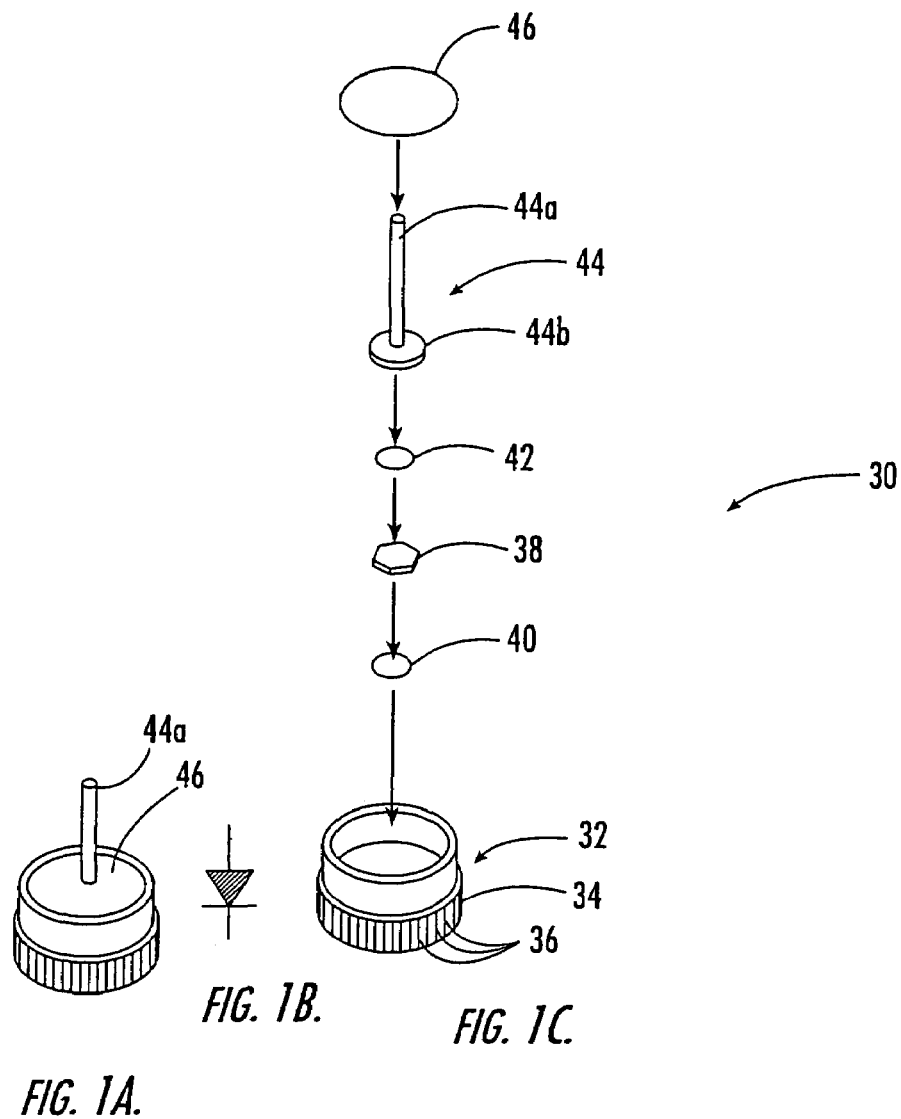
FIG. 1A is an isometric view of a diode subassembly of the present invention.
FIG. 1B shows the polarity direction of the diode subassembly of FIG. 1A.
FIG. 1C is an exploded isometric view of the diode subassembly shown in FIG. 1A.

FIG. 1C illustrates an exploded, isometric view of a press fit diode subassembly 30 that could be processed in accordance with the present invention. As illustrated, the press fit diode subassembly includes a lower diode cup 32 having a circular configuration. The interior portion of the diode cup 32 includes a raised, annular die mount 32a. The lower edge portion 34 of the diode cup has serrations 36 (FIGS. 1A, 1C, 2, 3, 6 and 7) to allow a press fit within a close tolerance orifice of a cooling plate of a rectifier. A diode cup is typically formed as a copper cup that is nickel plated.

Figure 5:
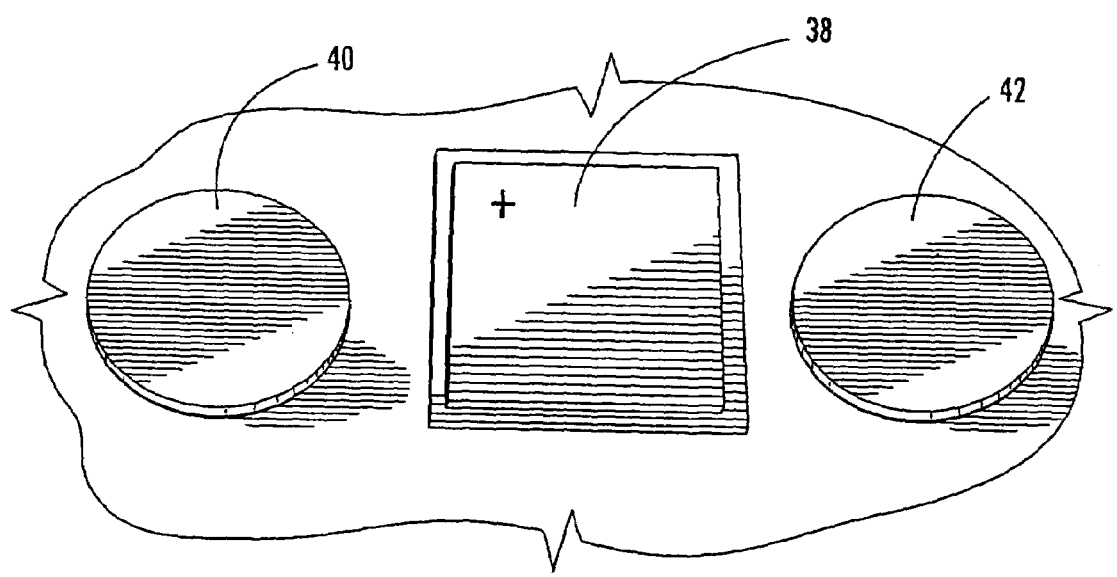
FIG. 5 shows a perspective view of a silicon diode die and two solder preforms positioned on either side that are circular configured and used for the process of the present invention.
Figure 8:
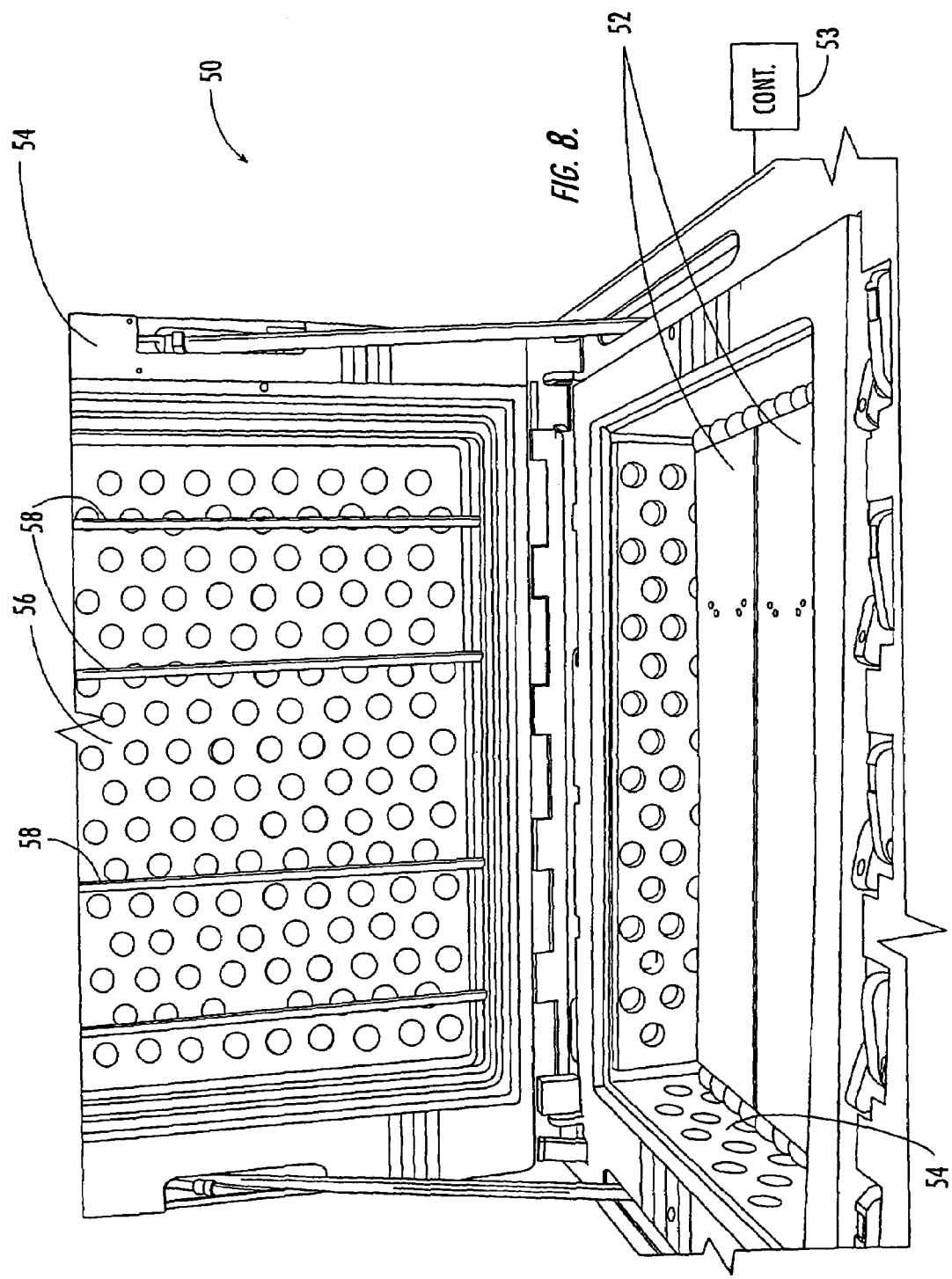
FIG. 8 is a perspective view of a vacuum furnace that receives diode boats containing the incomplete diode subassemblies for reflow soldering.

The silicon semiconductor diode die shown at 38 is reflow soldered with the solder preforms 40,42 into the diode cup using a furnace, such as shown in FIG. 8. Although a six-sided semiconductor diode die 38 is shown in FIG. 1C, and square configuration is shown in FIG. 5, any type of configuration is possible as known to those skilled in the art. A stand-up diode lead 44 rests on solder preform 42, and an epoxy layer 46 is used as a sealant. The diode lead 44 includes a stem 44a and circular base 44b. Polarity of the semiconductor diode die 38 is confirmed during the manufacturing process such that the flat underside of the diode cup at its circular base 44b corresponds to the cathode and the stem 44a corresponds as the anode.

Figure 2:
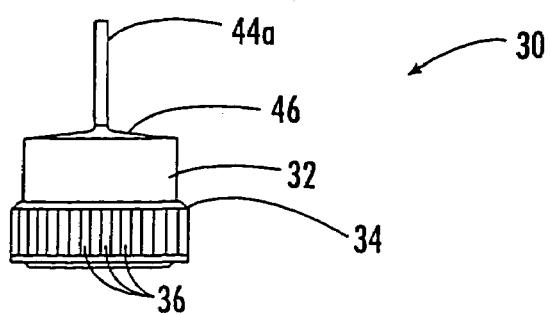
FIG. 2 is a sectional view of the diode subassembly shown in FIG. 1A.

As shown in FIG. 2, the diode subassembly 30 has a diode cup with a diameter about the size of its height. This size can vary. The stand-up diode lead 44 is reflow soldered. The stand-up diode lead 44 can be a nickel plated copper lead, in one aspect of the present invention.

Figure 3:
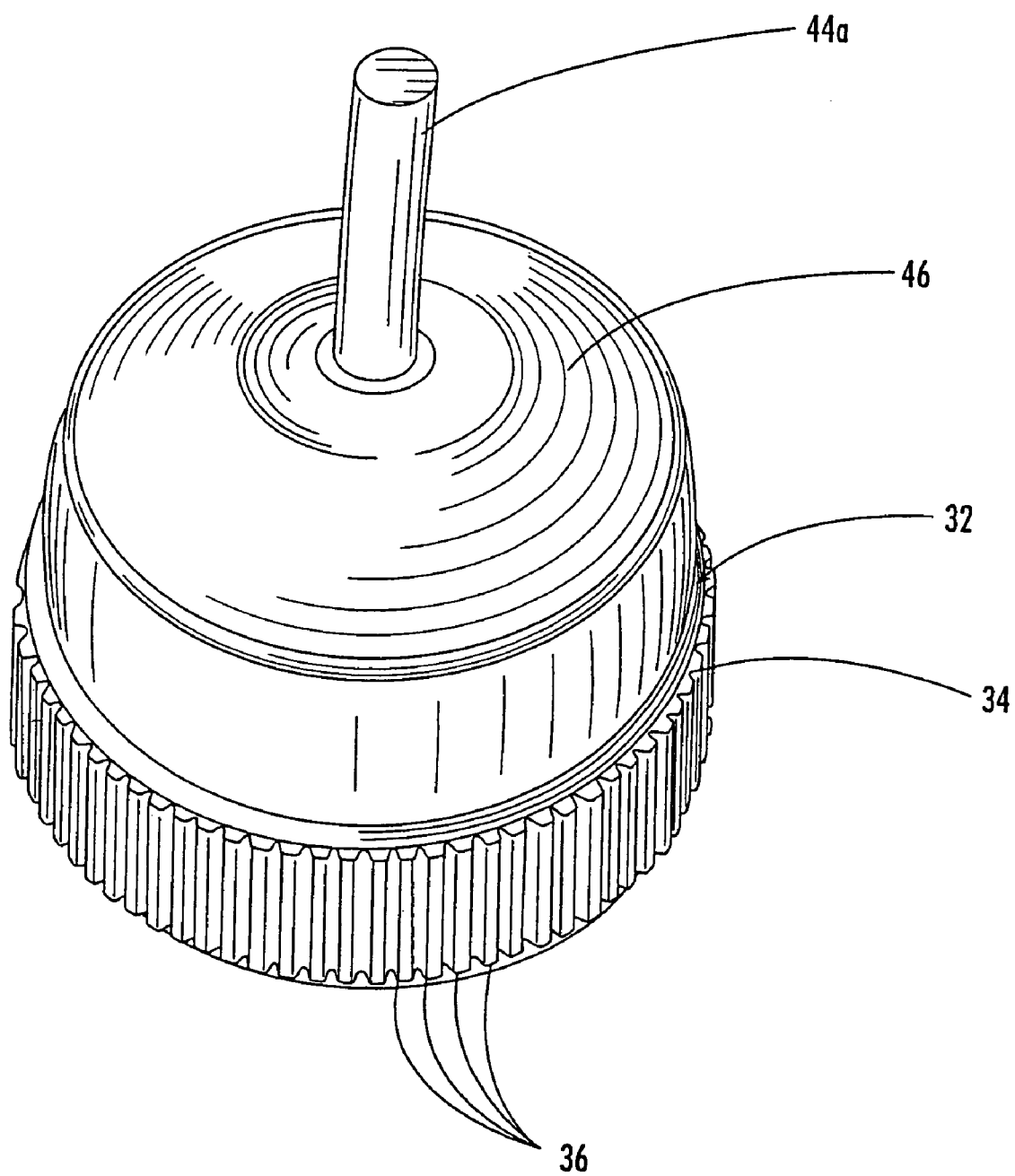
FIG. 3 is an enlarged isometric view of the diode subassembly shown in FIG. 1A.
Figure 4:
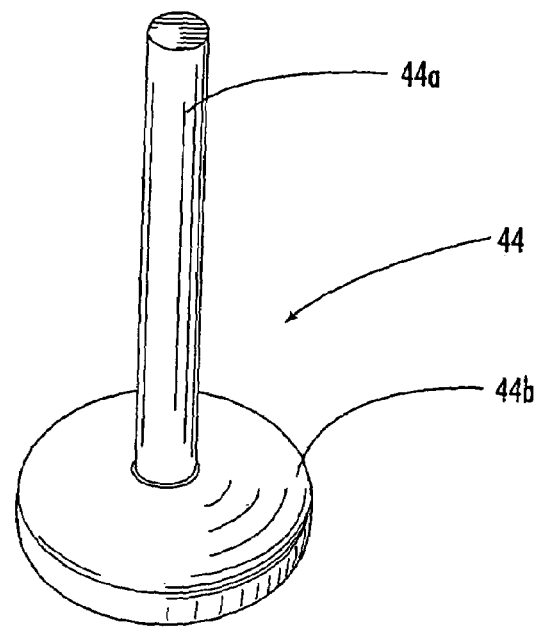
FIG. 4 is an enlarged isometric view of the stand-up diode lead that fits into the diode cup as shown in FIG. 1C.
Figure 7:
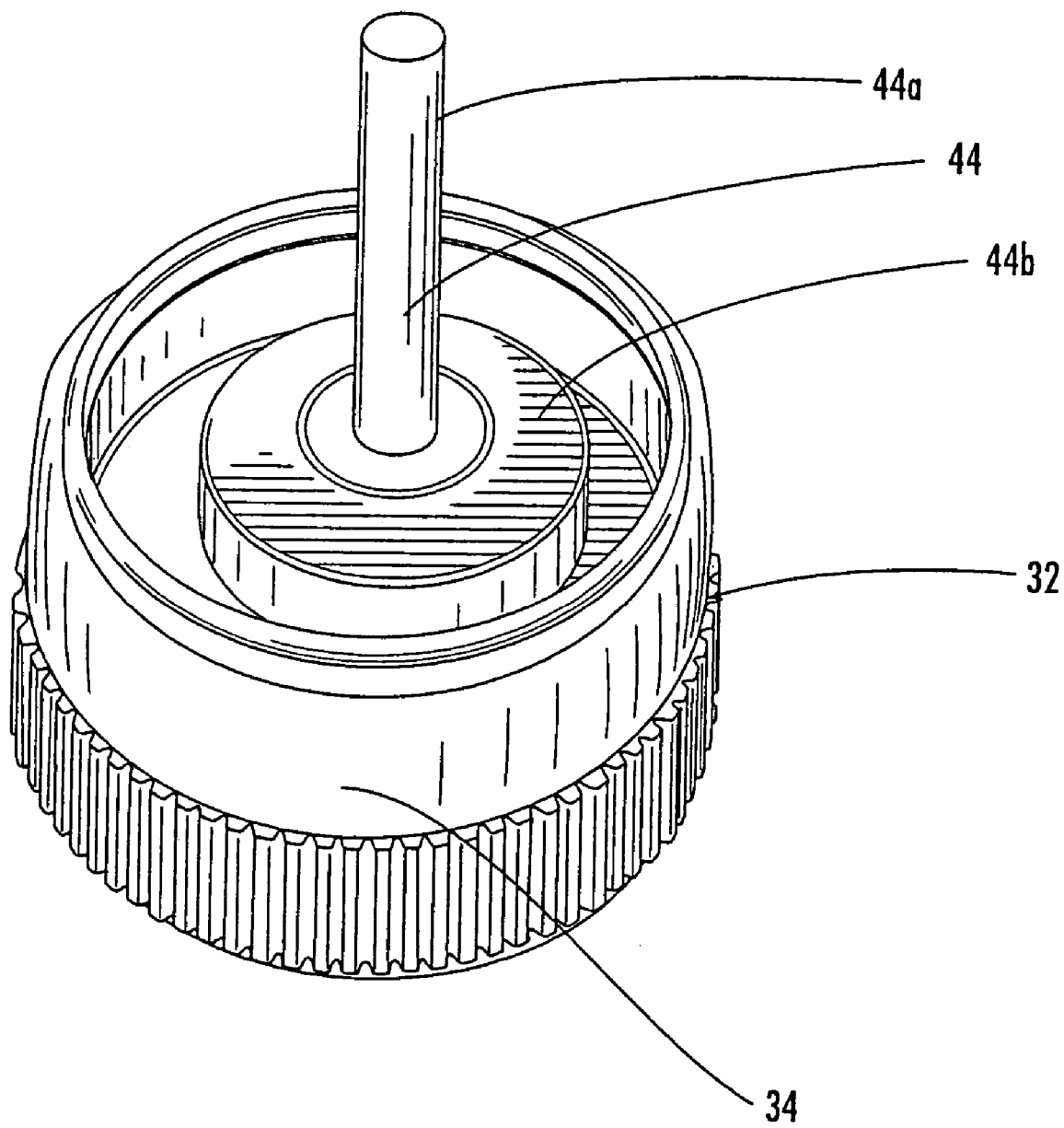
FIG. 7 is another perspective view of a partially assembled diode subassembly showing the stand-up diode lead soldered onto the silicon diode die.

After the stand-up diode lead and silicon semiconductor diode die are reflow soldered using the preforms 40,42, the partially assembled diode subassembly as shown in FIG. 7 is tested. After testing, the epoxy coating or sealant 46, as shown in FIG. 3, is then placed into the cup as a seal. Before epoxy sealing, other barriers or sealants could be inserted as well. The epoxy sealant 46 should not exceed the top of the diode cup wall at the perimeter and there should be a minimum to cover the diode lead base 44b. There should be no epoxy on the exposed diode lead stem 44a except for the wicking of the epoxy at the diode lead/epoxy interface as shown in FIG. 7.

Figure 6:
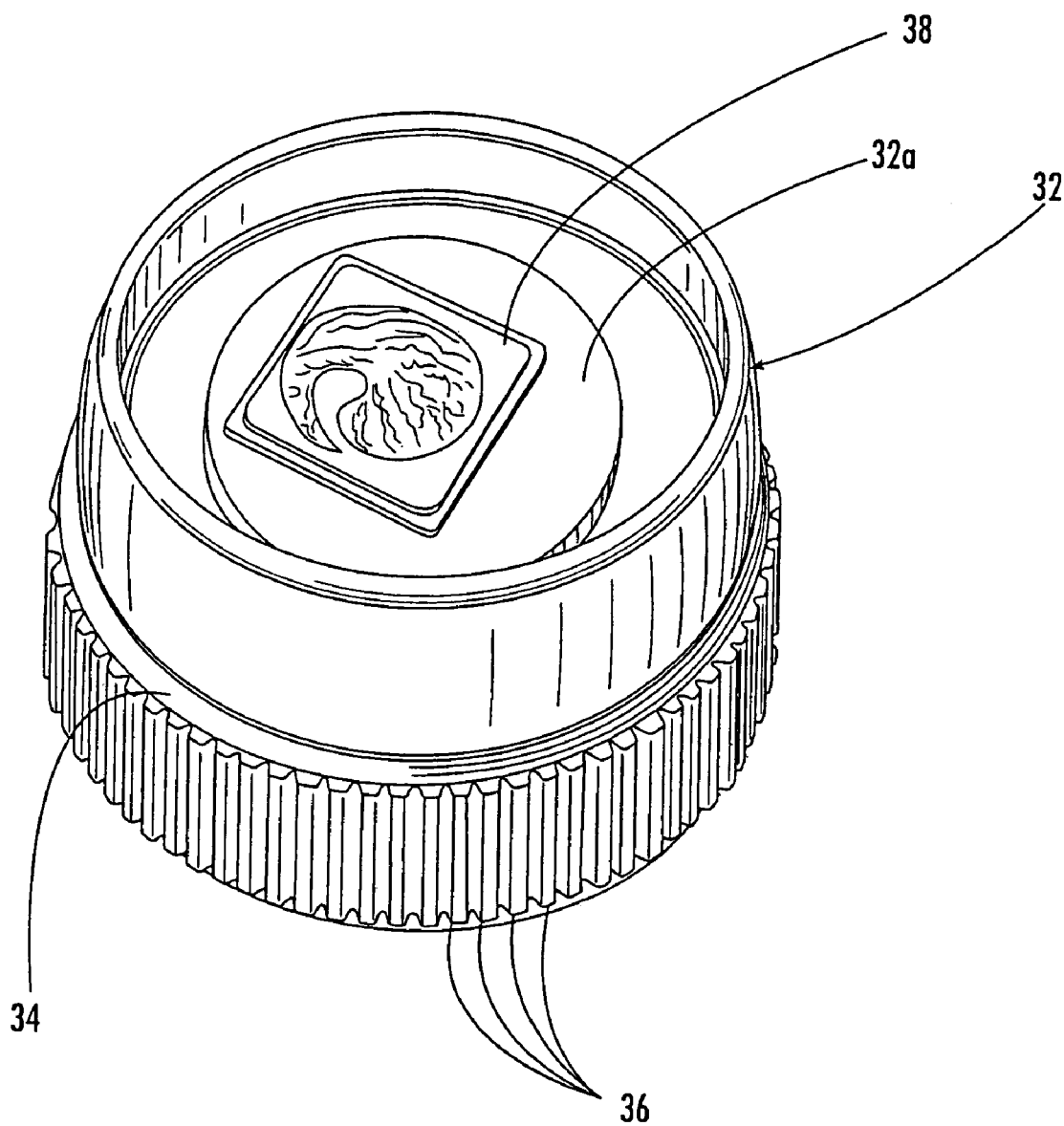
FIG. 6 shows a partially disassembled diode subassembly with the die attached to the circular base plate within the diode cup, where the stand-up diode lead has been forcibly removed and showing the solder on top of the silicon diode die.

FIG. 5 illustrates in detail the two circular configured solder preforms 40,42 with the silicon semiconductor diode die 38 in the middle and showing the relative size of the silicon semiconductor diode die and solder preforms. FIG. 6 shows a partially assembled press fit diode subassembly 30 after soldering where the stand-up diode lead has been forcibly removed to show the solder reflow bond as broken on top of the silicon semiconductor diode die.

FIG. 8 shows an example of a type of controlled atmosphere vacuum furnace 50 that can be used for the process of the present invention. An example of the type of vacuum furnace that can be used is a model PF-2400 vacuum furnace, as manufactured by Science Sealing Technology of Downey, Calif. Other types of vacuum furnace 50 can be used.

In accordance with the present invention, an argon/hydrogen gas mixture is used to allow better soldering, and in one aspect, reflow soldering. The hydrogen gas helps remove the oxide layers and aids in cleaning the surface. At one time, it was believed that nitrogen was essential and hydrogen was not needed. It has been found by the use of the present invention that the argon/hydrogen atmosphere is advantageous. In one aspect of the present invention, an 80% argon mix relative to a 20% hydrogen mix has been found advantageous. The solder used in the present invention can be a lead-tin-indium solder and is advantageous in the controlled furnace atmosphere.

There will now follow a basic description of the furnace shown in FIG. 8 as an example of a type of furnace that can be used with the present invention. Although many types of furnaces can be modified according to what one skilled in the art requires to practice in the present invention, the following description of the furnace will be a generic description only for purpose of understanding and is relevant to model PF-2400 identified above.

The furnace can include a vacuum unit intended for low temperature ceiling applications of about 400° C. or less. It has been found advantageous to reflow solder at these temperature. The heating system can use a low voltage circuit of three fixed length graphite platens 52 that are arranged substantially parallel about 0.25 inches apart and individually controlled by controllers 53. Two of the platens 52 are shown in FIG. 8. A three phase system using individual phase angle fired silicon controlled rectifier (SCR) units with AC outputs could provide the necessary heater power required for practicing the invention. A two-stage vacuum pumping system draws air out of the furnace down to a level of about 10 millitorr. A pressurization system is used and programmable to select between different gas inputs to operate between vacuum and pressure up to about 60 pounds per square inch.

Temperature control allows changed increments of up to about 1° C., and up to about 400° C. The platens 52 are about eight inches wide with a usable heated length of about 30 inches to form a combined heated area of about 725 square inches.

In operation, diode boats for carrying the partially assembled diode subassemblies are loaded into the furnace and onto the platens. The process parameters can be microprocessor controlled from stored programs that allow a desired temperature and pressure for atmospheric control over ramping, soaking, and cooling. These atmospheric control functions can be initiated at any point in a cycle and can be controlled based on time or any atmosphere level that has been achieved.

As illustrated, the furnace is rectangular configured and includes an interior, rectangular configured processing chamber 54 holding the platens 52 and using a hydraulically actuated lid 56. When in the full open position as shown in FIG. 8, all of the processing diode boats are directly accessible to the operator. It is possible that one side of the furnace could engage an end-line conveyor to increase processing control and automation. An operator console could be located on the other side of the furnace to control automated operation.

The furnace can include gas cooling rakes 58, such as those positioned in the lid 56 as shown in FIG. 8. Phase angle fired silicon controlled rectifiers could control the graphite platens. The atmosphere in the furnace can be controlled by different techniques, such as digitally controlled means. Valves are controlled to provide for back fill, pressurization and cooling. A digitally controlled regulator can feed proportional pressure signals to a distribution manifold using selection valves in a one-to-one ratio pilot operated regulator.

The processing chamber can be made from a welded stainless steel or other similar material, including an inner and outer wall to accommodate water cooling. Naturally, the lid is hermetically sealed when closed. In one configuration, upper and lower gas rakes can be positioned to create a turbulent flow directly over any processing diode boats and underneath the graphite platens. The processed gas used in the present invention and any air can be selected from different, e.g., three gas inputs, using a programmed flow rate as necessary by one skilled in the art. The system can cool a diode quickly to a desired handling temperature and for later inspection.

Figure 9:
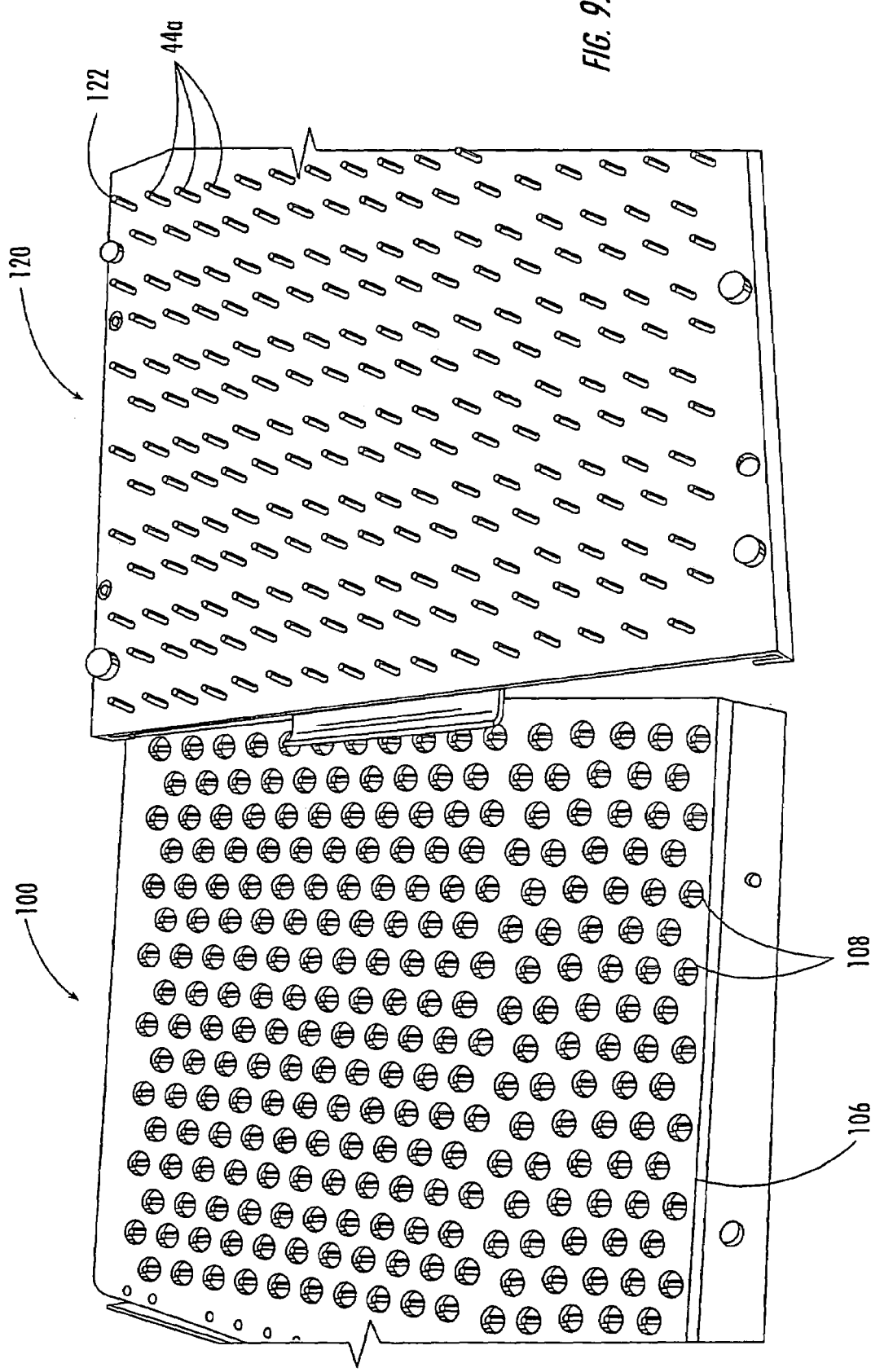
FIG. 9 is a perspective view of a diode boat having diode cups contained in the lower boat member and showing the upper plate that covers the lower boat member and a lead loader positioned adjacent the diode boat and showing diode leads extending upward from the lead loader such that when the lead holder is removed, the diode leads fall through the orifice in the upper plate into the diode cups.

As noted before, the diode subassemblies are processed in diode boats 100 that are placed within the processing chamber 54 of the furnace 50 on the platens 52. As shown in FIG. 9, diode subassemblies 30 are placed within a diode boat 100 as formed as a lower boat member 102 (FIGS. 16–19) and contained in diode retaining orifices 104. An upper retaining plate 106 is positioned over the lower boat member 102 and retains the diode cups 32 within the diode retaining orifices 104. The upper retaining plate 106 includes orifices 108 through which diode leads can extend and the diode lead can be dropped with the circular base first.

Figure 12:
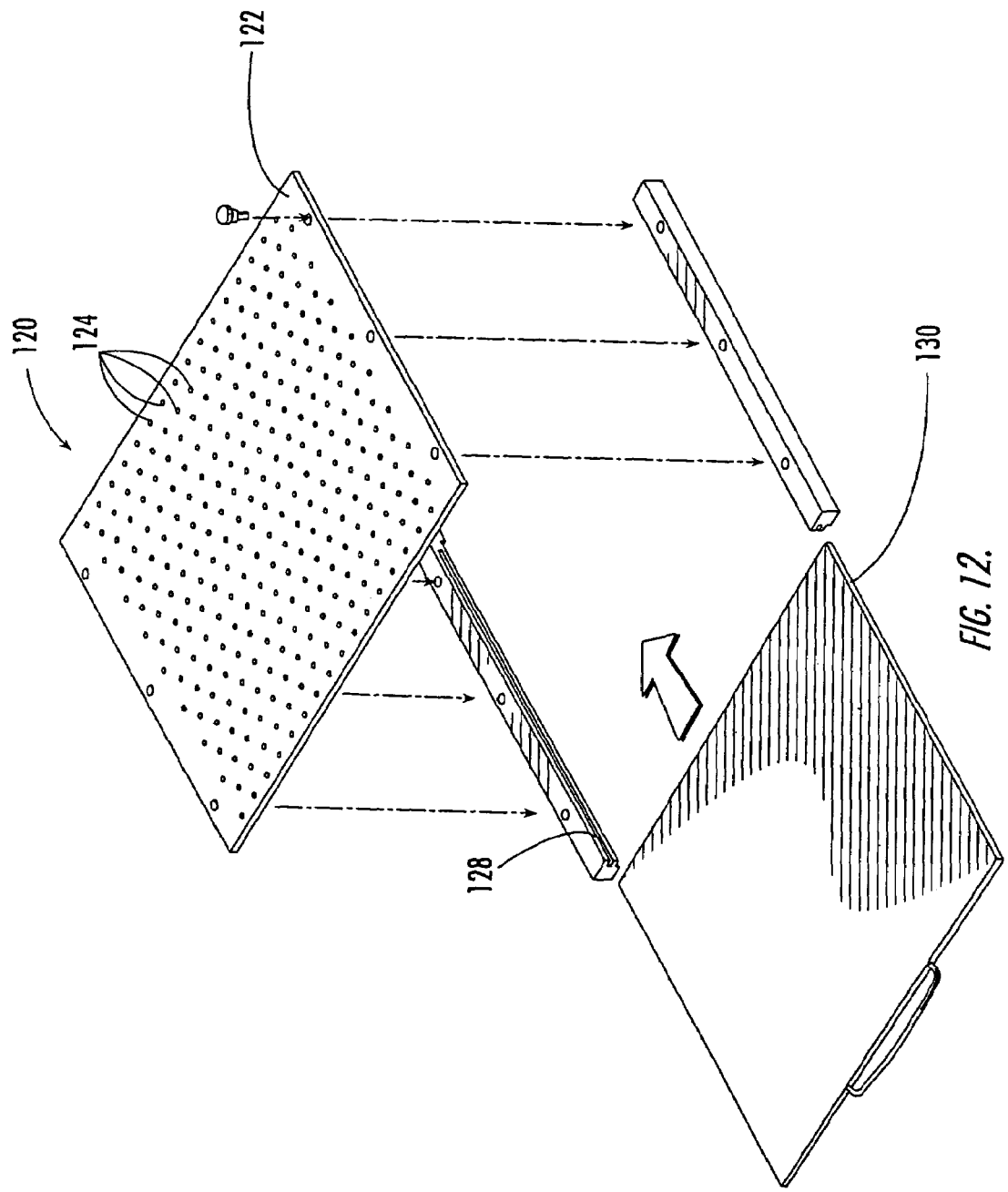
FIG. 12 an exploded isometric view of a lead loader and lead holder that is slidably removed within the guide channels of the lead loader.

When a number of diode cups 32 are placed in the diode retaining orifices 104 in the lower boat member 102, such as the diode cups that are illustrated per diode boat in FIG. 9, diode leads are paced in a lead loaded 120 as shown in FIGS. 9 and 12. Although a diode boat can be formed to contain any number of diode cups, in one aspect, 172 diode cups are illustrated. As shown in FIG. 12, the lead loaded 120 includes a diode lead plate 122 having small diode stem orifices 124 through which the diode stem extends. To insert diode leads 44, the lead plate 122 is inverted and the diode leads inserted, stem first.

The lead loader diode plate 122 includes end supports 126 as illustrated in FIG. 12, which have a groove 128 through which a lead holder 130 is slidably inserted and removed. When the diode leads are positioned where the diode stems 44a extend through the orifices 124, the lead holder 130 is slidably placed within the grooves 128 and retains the diode base 44b such that the diode stem cannot fall out of the orifices when the lead loader is inverted.

Figure 10:
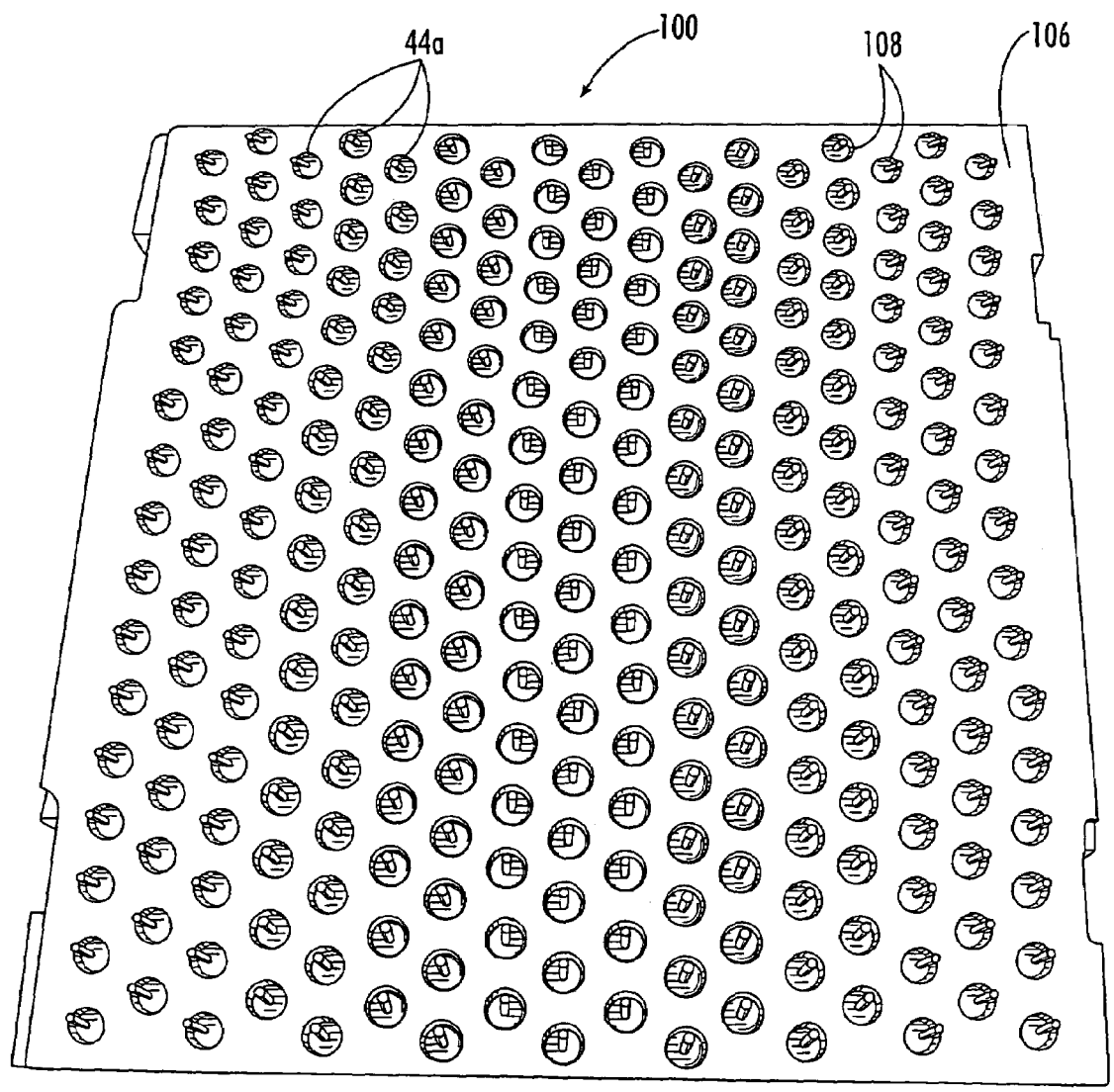
FIG. 10 is another view of the diode boat shown in FIG. 9.
Figure 13:
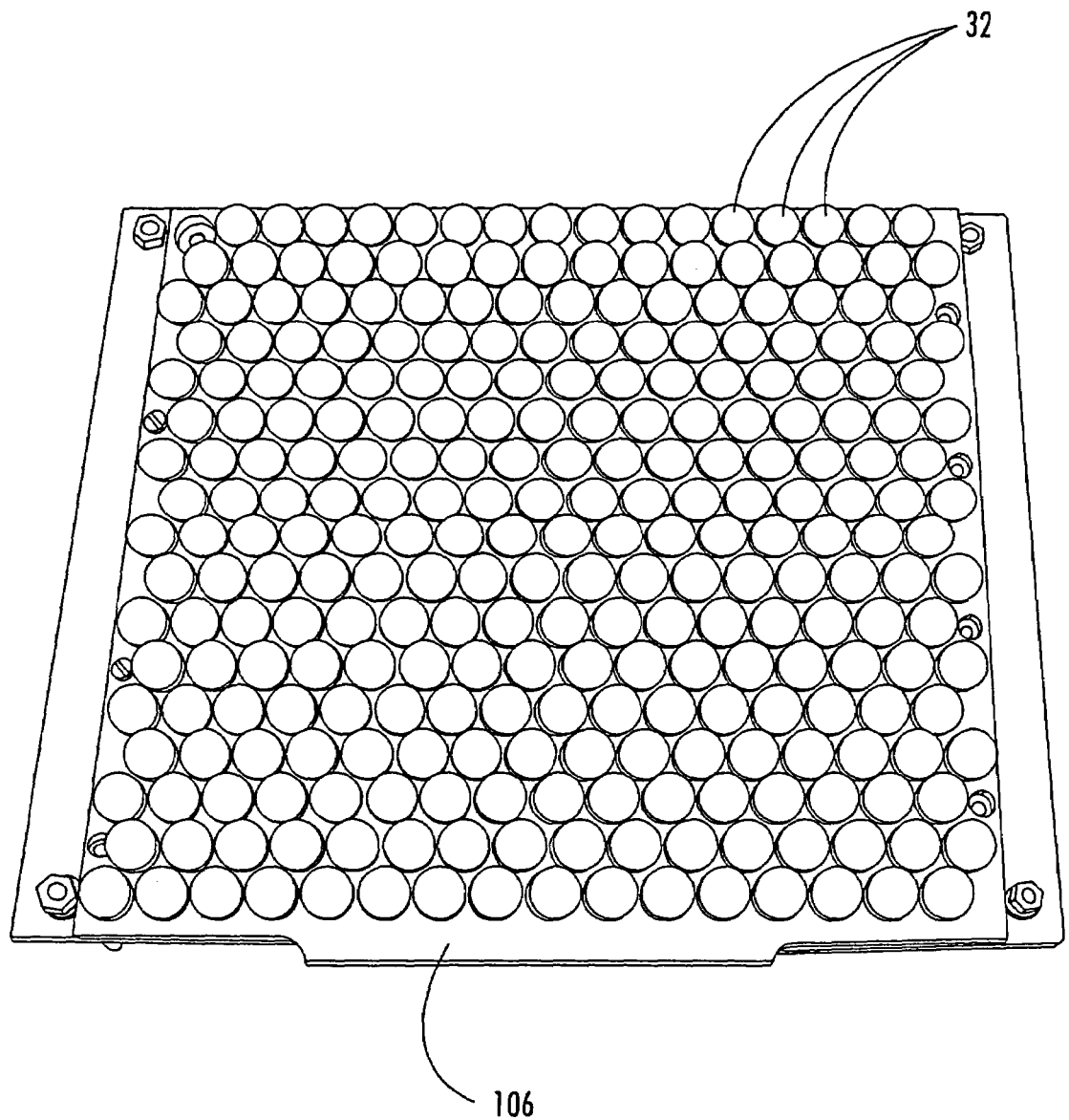
FIG. 13 is a perspective view of the upper retaining plate turned over wherein diode cups are positioned therein and showing the bottom surface of the diode cups.

After the semiconductor diode die and solder preforms are placed within the diode cup, the lead loader 120, as shown in FIG. 9, is inserted in place over the diode boat 100 having the upper retaining plate 106 such that the respective holes (orifices) as machined are aligned with each other. The diode leads are positioned in a position over the orifices 108 through which diode leads can extend on the upper retaining plate. The lead holder 130 is slidably removed and the diode leads drop into the diode cups. The lead loader 120 can then be removed off the diode boat and the diode boat, as shown in FIG. 10, can be placed in the furnace for reflow soldering. FIG. 13 illustrates an inverted portion of the diode boat where the lower boat member is removed, showing the diode cups 32 retained within the upper retaining plate 106.

Figure 14:
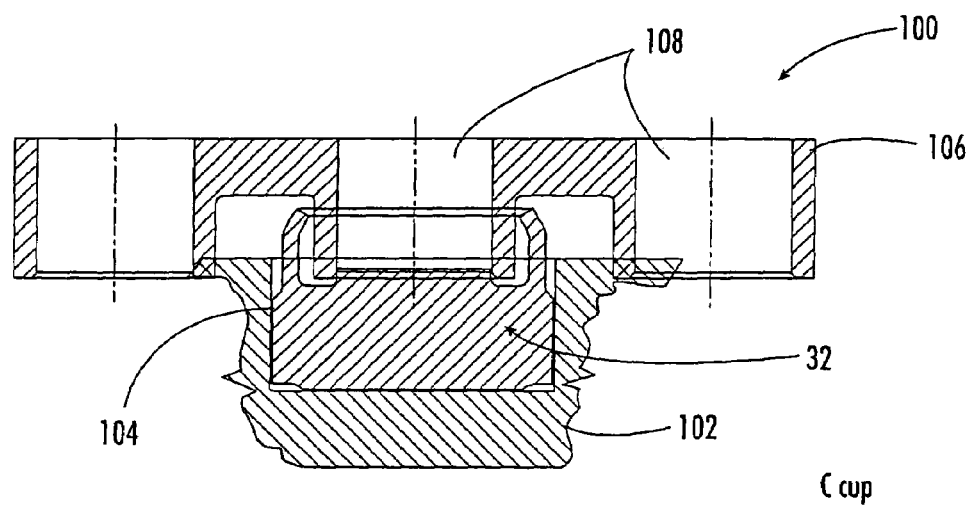
FIG. 14 is a sectional view of a small portion of a diode boat and showing a diode cup contained within a diode retaining orifice in the lower boat member and an upper retaining plate positioned over the lower boat member and retaining the diode cup therein for a first type of diode cup called a "C" cup.
Figure 15:
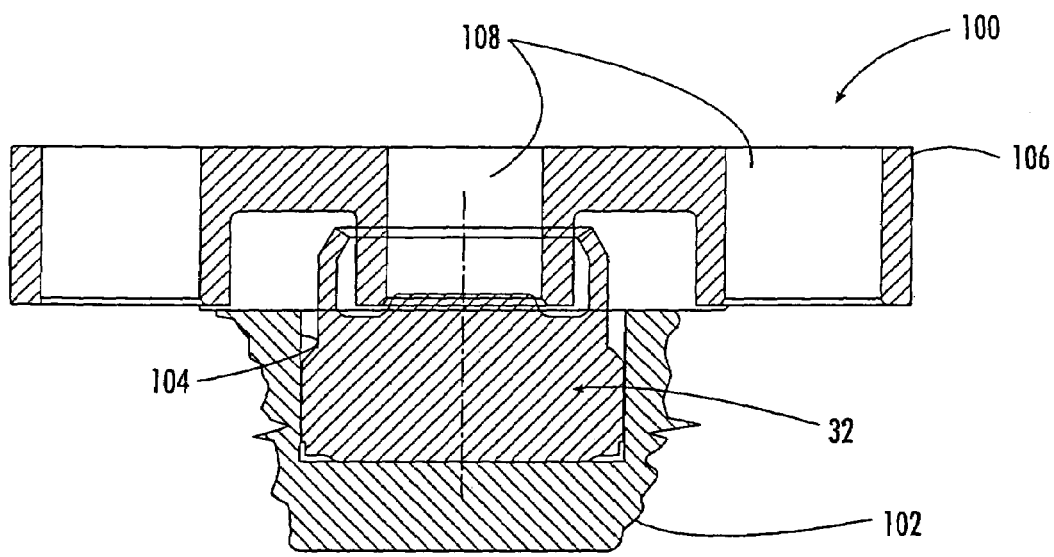
FIG. 15 is a view similar to FIG. 14, but showing a small difference in size for a "B" cup.
Figure 19:
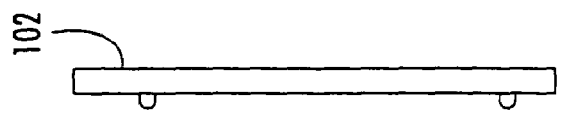
FIG. 19 is a side elevation view of the lower boat member shown in FIG. 16.
Figure 16:
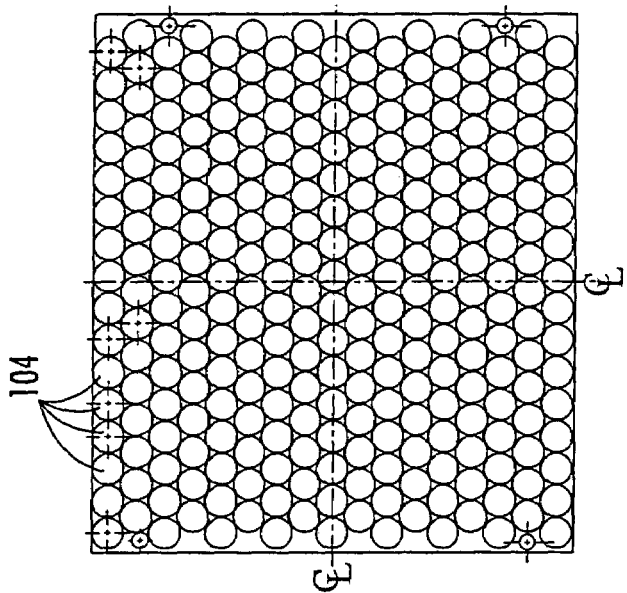
FIG. 16 is a plan view of a lower boat member.
Figure 18:
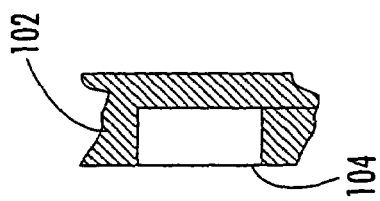
FIG. 18 is a sectional view taken along line 18—18 of FIG. 17.
Figure 17:
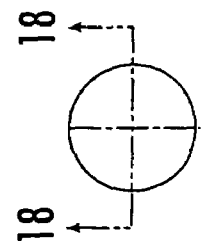
FIG. 17 is an enlarged view of a diode retaining orifice as shown in FIG. 16.

FIGS. 14–15 show two types of diode boats 100 very similar to each other, but allowing a different type of diode subassembly to be soldered therein. As shown in FIG. 15 for a "B" cup, which is somewhat larger than a "C" cup, FIG. 15 allows larger dimension diode subassemblies. FIGS. 14 and 15 show the lower boat member 102 in fragmentary sectional view with a diode cup held therein and an upper retaining plate positioned thereover.

FIGS. 20–22 show the upper retaining plate 106 in fragmentary plan view (FIG. 20) and fragmentary sectional view (FIG. 22) of a portion in detail as shown in FIG. 21 for a "B" cup, while FIGS. 23–25 show a portion for a "C" cup.

Figure 26:
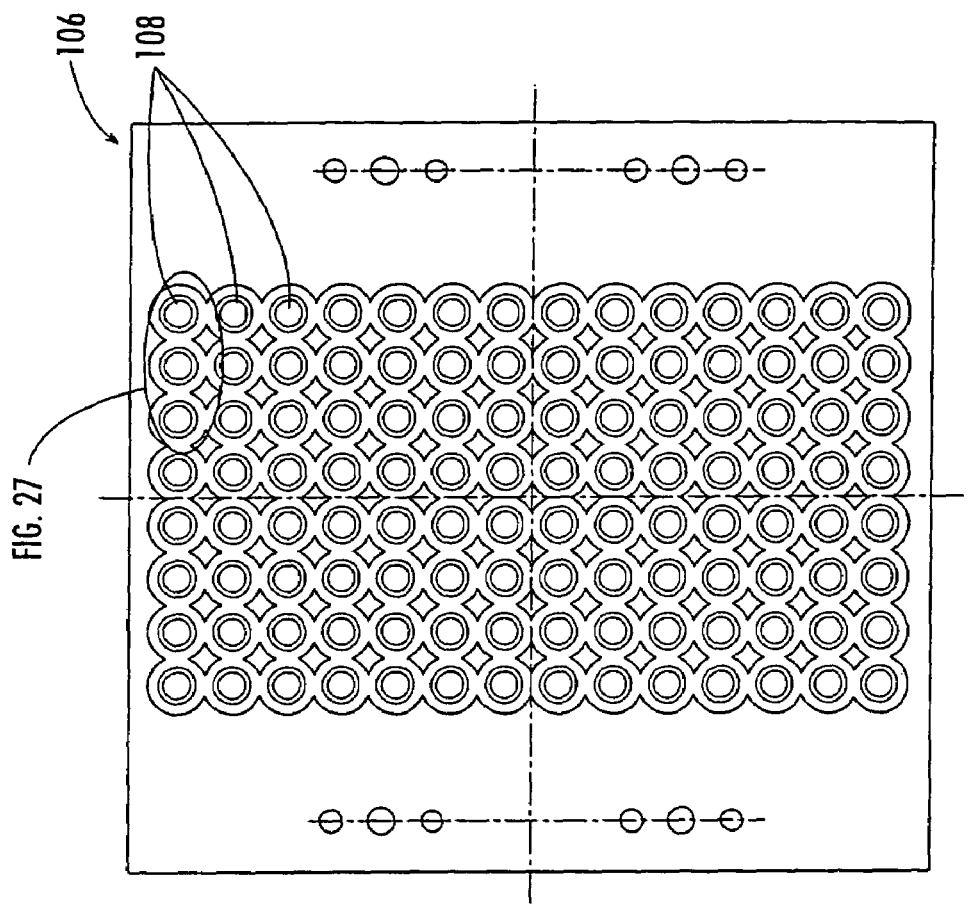
FIGS. 26–28 are views similar to FIGS. 20–22 and 23–24, but showing the structure for use with a diode subassembly such as used with a DR4000 rectifier assembly.
Figure 27:
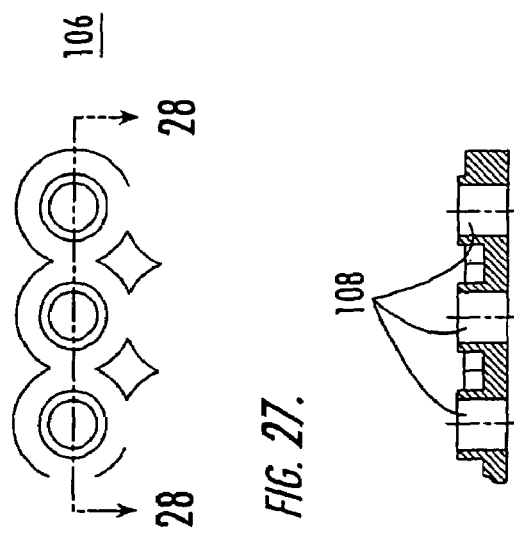
Figure 28:
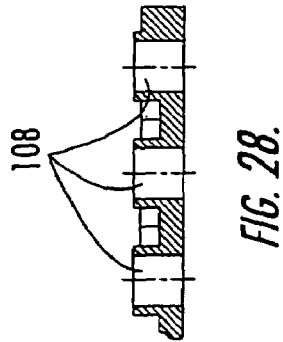

FIGS. 26–28 show similar views, but for a known type of manufactured diode subassembly used with a DR4000 rectifier that is commercially marketed by Transpo Electronics, Inc.

Figure 11:
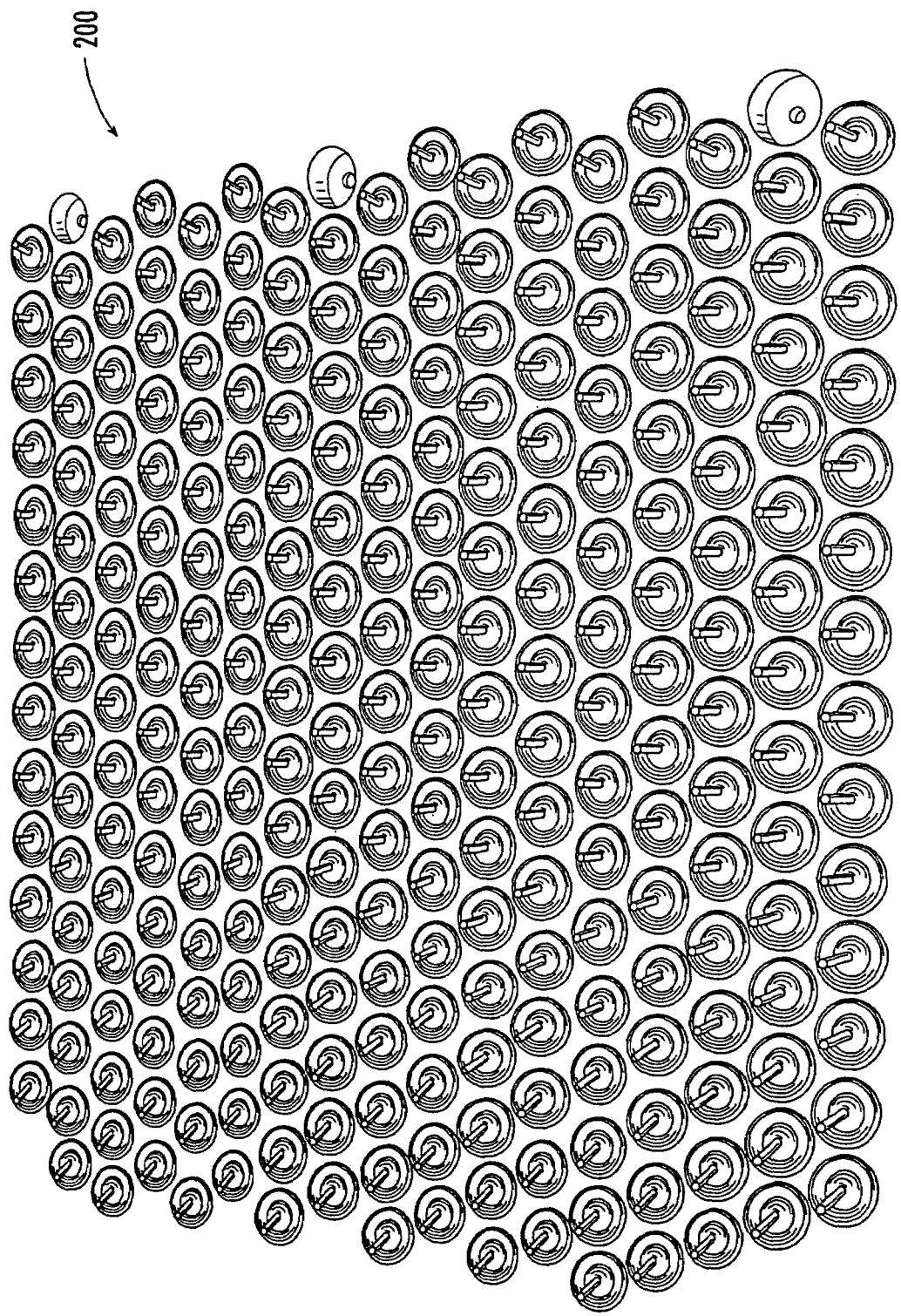
FIG. 11 is another view of a lower boat member without an upper retaining plate.

After reflow soldering in the furnace, which is controlled as noted above, the diode subassemblies can be transferred to an aluminum diode boat 200, as shown in FIG. 11, similar in design to a graphite diode boat, but which is not formed from a graphite material because it does not have to withstand heat. For example, the graphite diode boat 100 could be inverted and the lower boat member 102 removed from the upper retaining plate 106, as shown in FIG. 13. The upper retaining plate 106 formed from aluminum of the aluminum diode boat is positioned thereon and then inverted again. The graphite upper retaining plate is removed and an aluminum retaining plate positioned thereon to form a complete aluminum diode boat. This allows quick and accessible interchange of different diode boats.

At the time when the diode subassemblies are positioned within the aluminum diode boat, a separate test assembly can be positioned on the aluminum diode boat and testing of each diode subassembly can occur. After testing, the epoxy sealant can be added. The diode subassemblies, once completed with the epoxy sealant, and once tested, can be removed for further manufacturing into completed rectifier assemblies.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

The invention claimed is:

1. A method of manufacturing a diode subassembly used in rectifiers of engine-driven generators, wherein the assembly includes a diode cup, and semiconductor diode die and diode lead fitted therein, the method comprising the step of:
reflow soldering a semiconductor diode die and diode lead within a diode cup in an argon/hydrogen atmosphere with predominantly argon over hydrogen in volume and in an atmosphere of up to about 400° C.

2. A method according to claim 1, and further comprising the step of inserting solder preforms between the diode cup and semiconductor diode die and the diode lead and semiconductor diode die before reflow soldering.

3. A method according to claim 1, and further comprising the step of reflow soldering within an argon/hydrogen atmosphere of about 80 percent argon and 20 percent hydrogen by volume.

4. A method according to claim 1, and further comprising the step of reflow soldering under pressure to aid in forcing the semiconductor diode die, diode cup and diode lead together.

5. A method according to claim 1, and further comprising the step of reflow soldering at a pressure up to about 60 pounds per square inch.

6. A method according to claim 1, and further comprising the step of reflow soldering with a lead-tin-indium solder.

7. A method according to claim 1, wherein after the step of reflow soldering, comprises the step of sealing the diode cup, semiconductor diode die and diode lead with a sealant.

8. A method according to claim 7, wherein the step of sealing comprises the step of sealing with an epoxy.

9. A method according to claim 1, and further comprising the step of inserting solder preforms between the diode cup and semiconductor diode die and the diode lead and semiconductor diode die.

10. A method of manufacturing a diode subassembly used in rectifiers of engine-driven generators comprising the step of:
soldering a semiconductor diode die and diode lead within a diode cup in an argon/hydrogen atmosphere with predominantly argon over hydrogen in volume and in an atmosphere of up to about 400° C.

11. A method according to claim 10 and further comprising the step of inserting a solder preform between the diode cup and semiconductor diode die before the step of soldering.

12. A method according to claim 10 and further comprising the step of inserting a solder preform between the diode lead and semiconductor diode die before soldering.

13. A method according to claim 10 wherein the step of soldering further comprises the step of soldering within an argon/hydrogen atmosphere of about 80 percent argon and 20 percent hydrogen by volume.

14. A method according to claim 10 wherein the step of soldering further comprises the step of soldering with a lead-tin-indium solder.

15. A method according to claim 10 and further comprising the step of sealing the semiconductor diode die and diode lead within the diode cup with a sealant.

16. A method according to claim 15 wherein the step of sealing further comprises the step of sealing with an epoxy.

17. A method according to claim 10 wherein the step of soldering further comprises the step soldering under pressure to aid in forcing the semiconductor diode die, diode cup and diode lead together.

18. A method according to claim 17 wherein the step of soldering under pressure further comprises the step of soldering at pressures up to about 60 pounds per square inch.

19. A method according to claim 10 wherein the step of soldering further comprises the step of reflow soldering the semiconductor diode and diode lead within the diode cup.

* * * * *